United States Patent
Duppong et al.

(10) Patent No.: US 8,780,557 B2
(45) Date of Patent: Jul. 15, 2014

(54) POWER ELECTRONICS INVERTER WITH CAPACITOR COOLING

(75) Inventors: Jeffrey Scott Duppong, Fargo, ND (US); David Michael Loken, West Fargo, ND (US); Erich Joel Drees, Dilworth, MN (US)

(73) Assignee: Deere & Company, Moline, IL (US)

( * ) Notice: Subject to any disclaimer, the term of this patent is extended or adjusted under 35 U.S.C. 154(b) by 377 days.

(21) Appl. No.: 13/025,343

(22) Filed: Feb. 11, 2011

(65) Prior Publication Data

US 2012/0206950 A1   Aug. 16, 2012

(51) Int. Cl.
*H05K 7/20* (2006.01)
*H01L 23/34* (2006.01)
*H01B 9/06* (2006.01)

(52) U.S. Cl.
USPC ......... 361/699; 361/702; 165/80.4; 165/80.5; 257/714; 174/15.1; 363/141

(58) Field of Classification Search
USPC ........... 361/679.53, 699, 702; 165/80.4–80.5, 165/104.33; 257/714; 174/15.1; 363/141
See application file for complete search history.

(56) References Cited

U.S. PATENT DOCUMENTS

| | | | |
|---|---|---|---|
| 6,160,696 A | 12/2000 | Bailey et al. | |
| 6,166,937 A * | 12/2000 | Yamamura et al. | 363/141 |
| 6,313,991 B1 * | 11/2001 | Nagashima et al. | 361/699 |
| 6,987,670 B2 | 1/2006 | Ahmed et al. | |
| 7,393,236 B2 | 7/2008 | Thompson et al. | |
| 7,443,692 B2 | 10/2008 | Patwardhan et al. | |
| 7,542,318 B2 * | 6/2009 | Otsuka et al. | 363/178 |
| 7,952,856 B2 * | 5/2011 | Otsuka et al. | 361/624 |
| 7,974,101 B2 * | 7/2011 | Azuma et al. | 361/760 |
| 8,400,775 B2 * | 3/2013 | Ward et al. | 361/763 |
| 2007/0002594 A1 * | 1/2007 | Otsuka et al. | 363/37 |
| 2007/0109715 A1 * | 5/2007 | Azuma et al. | 361/299.3 |
| 2011/0116235 A1 * | 5/2011 | Ryu et al. | 361/699 |
| 2012/0138274 A1 * | 6/2012 | Shin et al. | 165/104.28 |

OTHER PUBLICATIONS

International Search Report and the Written Opinion of the International Searching Authority, dated Jun. 22, 2012 (9 pages).
AVX, "Film Technology to Replace Electrolytic Technology", [retrieved Mar. 16, 2011]. Retrieved from the Internet: http://www.avx.com/docs/techinfo/filmtech.pdf.

* cited by examiner

*Primary Examiner* — Zachary M Pape

(57) ABSTRACT

A power electronics inverter includes a housing which forms a cold plate with coolant passages. The housing encloses an insulated gate bipolar transistor (IGBT), and a DC Link capacitor. The capacitor comprises a bus-bar which exits from a bottom side of the capacitor, and the bus-bar is positioned adjacent to the cold plate. The cold plate forms a cooling passage which underlies the IGBT and the capacitor bus-bar. Thermally conductive gap pads are located between the capacitor bus-bar and the cold plate.

10 Claims, 4 Drawing Sheets

POWER ELECTRONICS INVERTER WITH CAPACITOR COOLING

FIELD OF THE INVENTION

The present disclosure relates to a power electronics module such as an inverter.

BACKGROUND OF THE INVENTION

A power electronics inverter normally includes key components such as an insulated gate bipolar transistor (IGBT), a DC Link capacitor, and cold-plate. In the working environment of a vehicle, the maximum ambient operating temperatures are 85° C. (outside of the inverter). The air inside the inverter is considerably warmer, due to waste heat from the operation of electronic components. A challenge with these components is to minimize the internal hot-spot temperature of the capacitor. The useful lifetime of a film-based capacitor's can be approximately doubled by lowering the operating temperature by 10° C. An alternative way to extend the capacitor's useful lifetime is to increase the amount of film, which enlarges the capacitor.

Such a capacitor has a set of electrically conductive bus-bars (typically made of copper) that are mechanically fastened to the terminals of the IGBT. In most known configurations, the bus-bar leads of the capacitor egress one side of the capacitor and their length is kept as short as possible to minimize inductance. See FIG. 1.

There are three primary heat sources that affect the hot-spot temperature of a capacitor, which is typically found deep in the central areas that are furthest from its surface. Heat is generated internally inside the capacitor during its normal operation. The medium surrounding the capacitor (typically hot air) will affect the capacitor's internal temperature. The IGBT in an inverter generates a large amount of waste heat. As a result, most high-power electronic inverters utilize a liquid-cooled cold-plate to conduct the heat from the IGBT out of the inverter. However effective the cooling of the IGBT may be, the internal components will be electrically driven until they are operating at temperatures in the neighborhood of 150° C. The electrical connections between the internal IGBT components and the capacitor must be capable of carrying a large amount of current. Copper is one material that is used to carry the current. Copper also has a high thermal conductivity value and is consequently capable of transferring heat between the IGBT and capacitor. Since the IGBT is hotter than the capacitor, the heat flows into the capacitor, which affects the hot-spot temperature.

SUMMARY

According to an aspect of the present disclosure, a power electronics inverter has a housing forming a cold plate, heat generating electronic first and second components.

According to another aspect of the present disclosure, one of the components is an a insulated gate bipolar transistor (IGBT) and the other components is a DC Link capacitor.

According to another aspect of the present disclosure, the capacitor includes a bus-bar which exits from a bottom side of the capacitor, and the bus-bar is positioned adjacent to the cold plate.

According to another aspect of the present disclosure, the cold plate forms a cooling passage which underlies the first component and the bus-bar.

According to another aspect of the present disclosure, thermally conductive gap pads are located between the bus-bar and the cold plate.

DETAILED DESCRIPTION OF THE DRAWINGS

Figure 1:
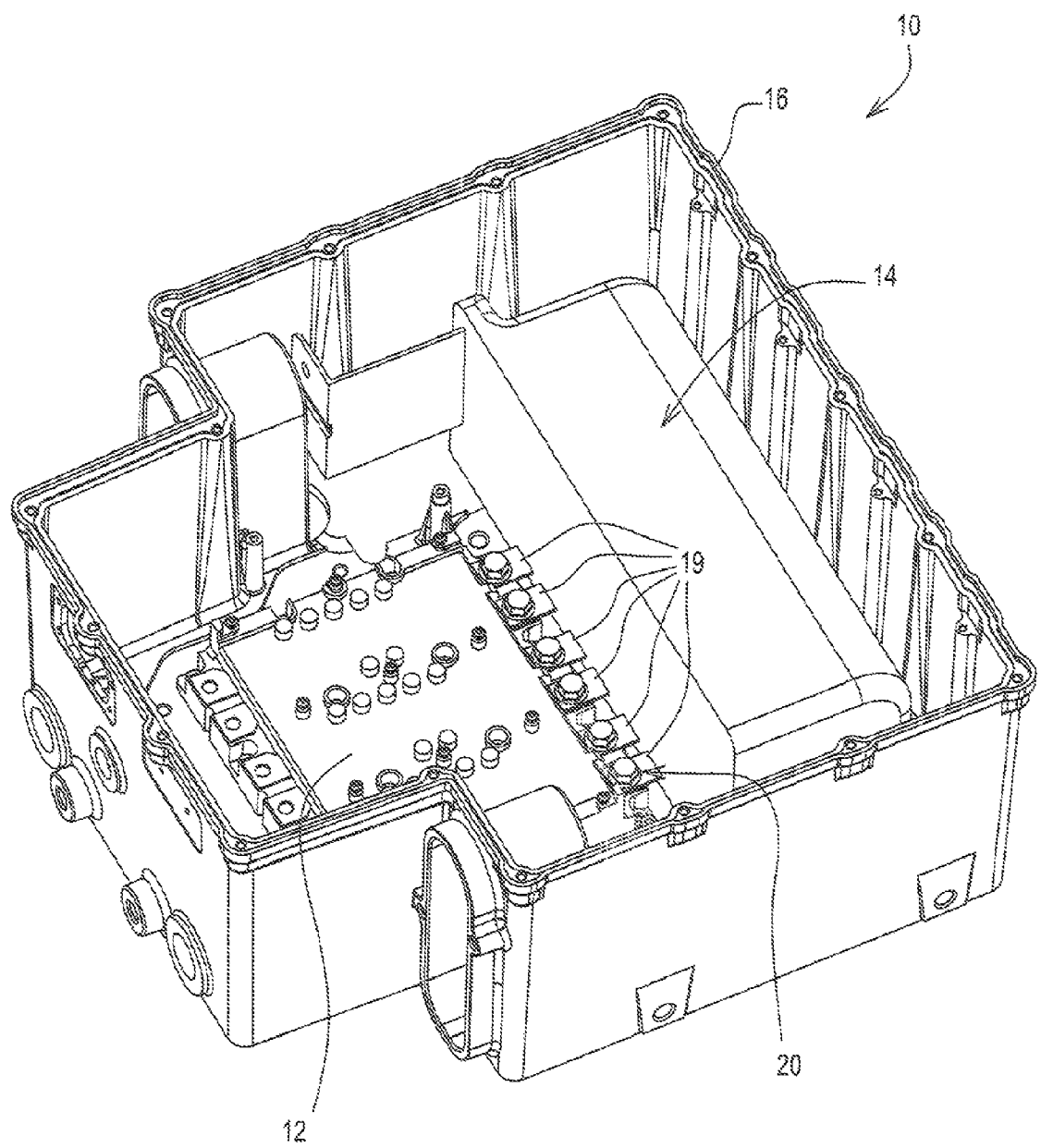
FIG. 1 is a perspective view of a prior art inverter.

Referring to FIG. 1, a prior art inverter 10 includes an insulated gate bipolar transistor (IGBT) 12 and a DC Link capacitor 14 mounted in a housing 16. The capacitor 14 has a set of electrically conductive bus-bars (not shown) (typically made of copper) that are mechanically fastened to the terminals 20 of the IGBT 12. The leads 19 of the bus-bar of the capacitor exit from one side of the capacitor 14 and their length is kept as short as possible to minimize inductance.

Figure 2:
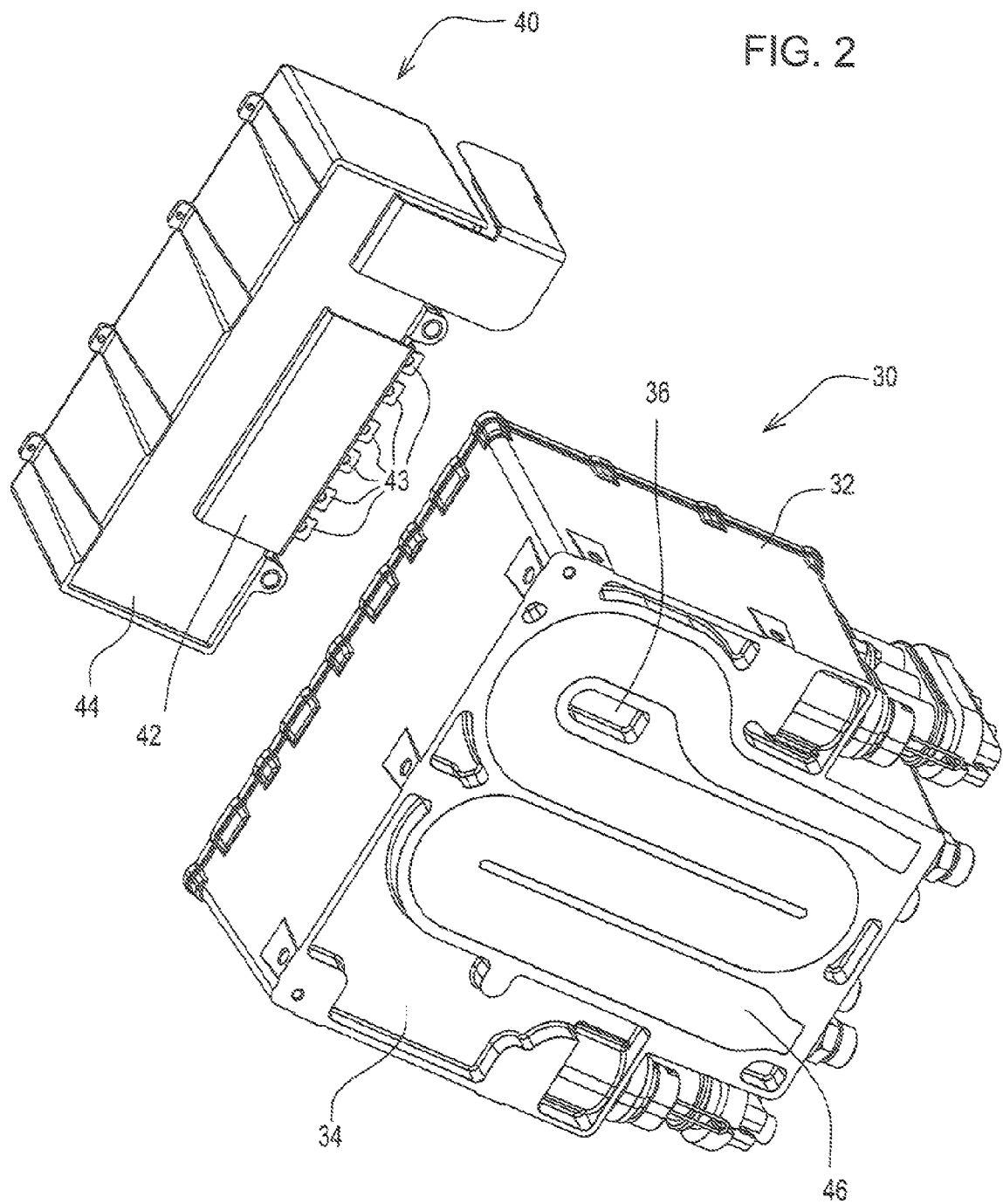
FIG. 2 is bottom perspective exploded view of an inverter according to the present invention.
Figure 3:
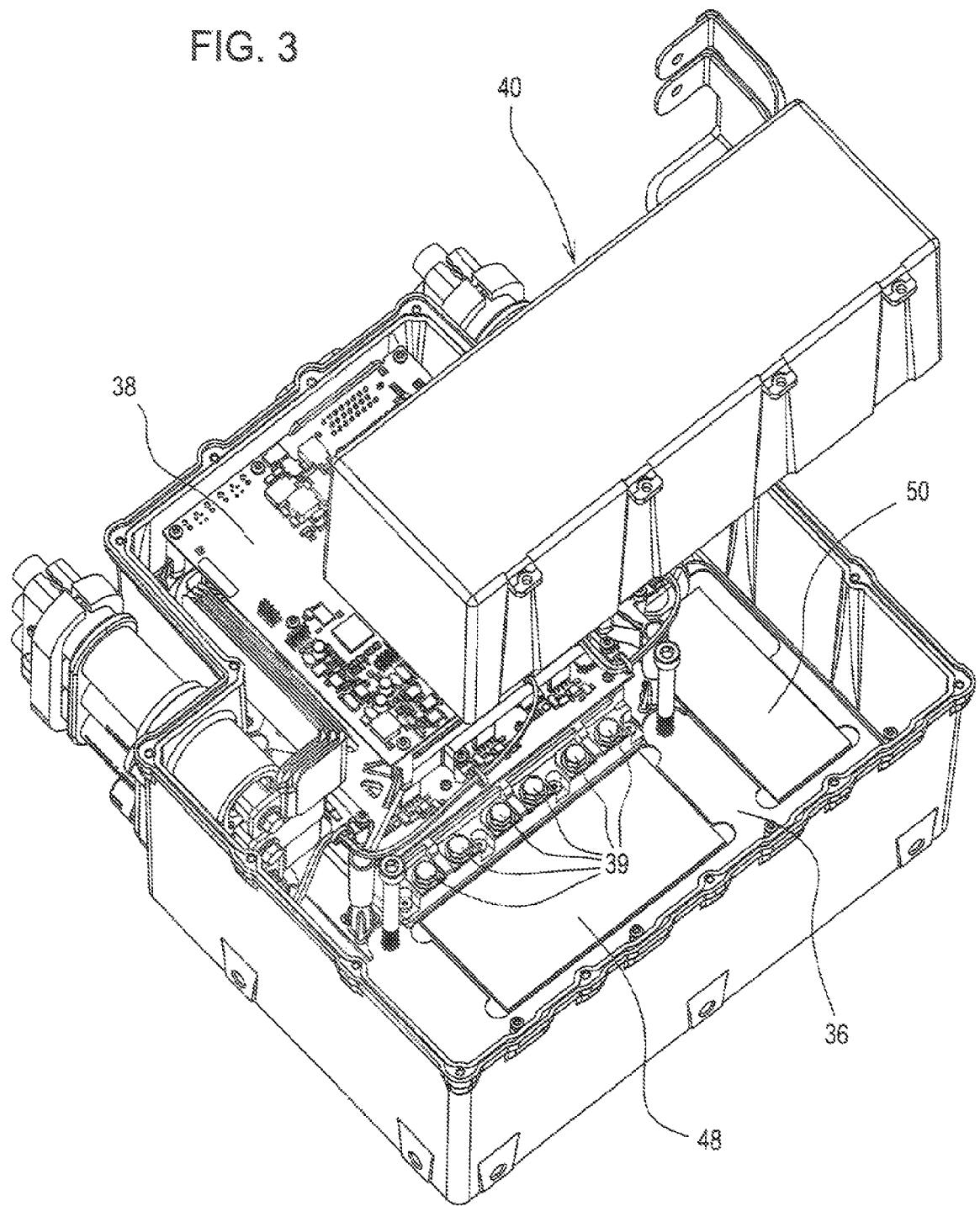
FIG. 3 is a top perspective exploded view of the inverter of FIG. 2.
Figure 4:
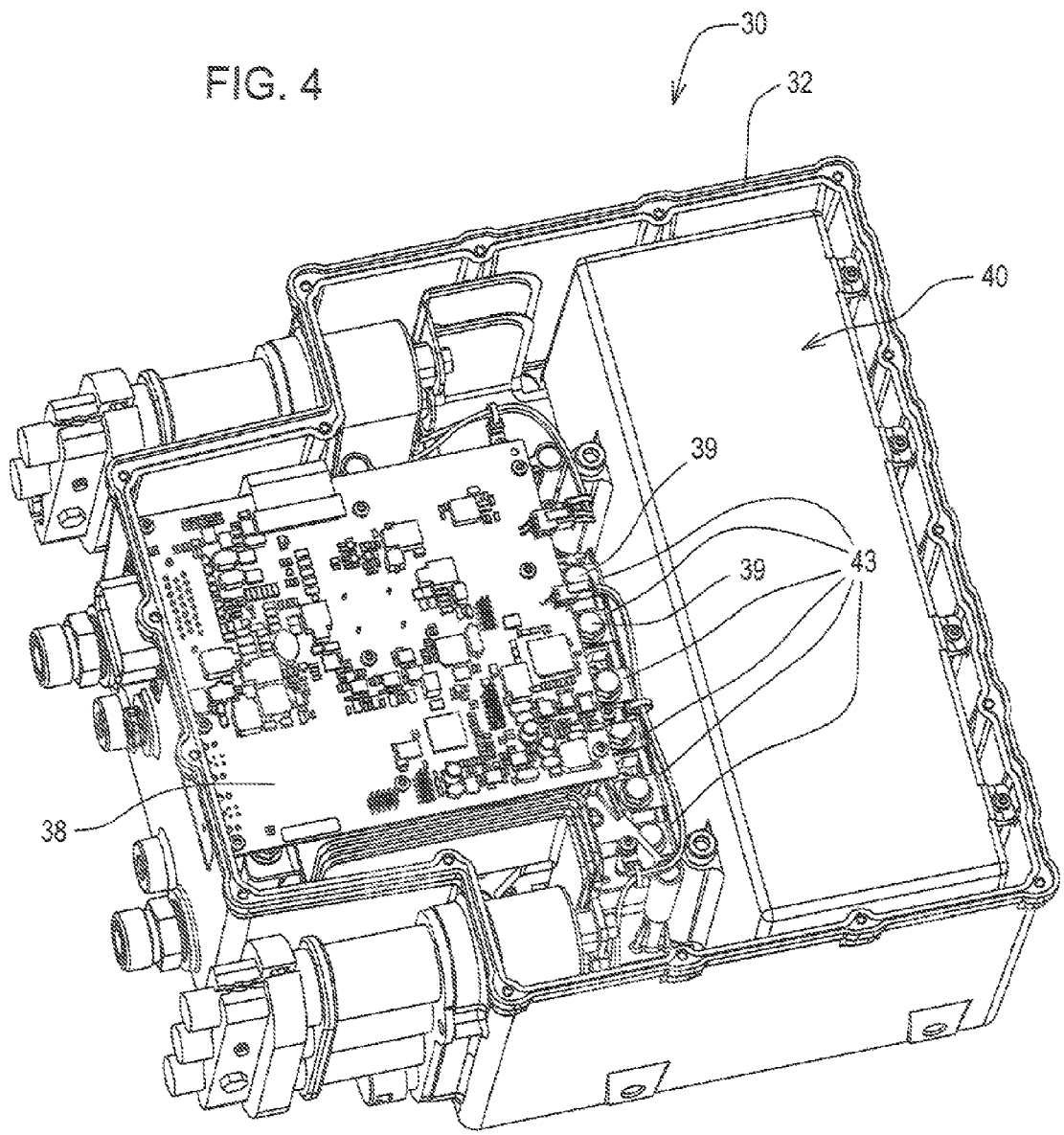
FIG. 4 is a top perspective view of the inverter of FIG. 2.

As best seen in FIGS. 2, 3 and 4, according to the present invention, the power electronics inverter 30 has a housing 32 with a bottom side 34 forming a cold plate 36. The housing 32 encloses a variety of electrical components, including a pair of heat generating components. One of the components may be a switch unit 38, such as an insulated gate bipolar transistor (IGBT), or other type of power device, such as Mosfets, SCRs, Thyristors, etc. The other component may be a capacitor unit 40, such as a DC Link capacitor, or any other type of capacitor, such as film, ceramic or electrolytic, for example. The switch unit 38 includes terminals 39. The capacitor 40 includes a bus-bar 42 which exits from a bottom side 44 of the capacitor 40, so that the bus-bar 42 will be positioned adjacent to the cold plate 36. The bus-bar 42 includes a plurality of tabs 43 which are attached to terminals 39 of the switch unit 38. The cold plate 36 forms a cooling passage 46 which underlies the switch unit 38 and the capacitor bus-bar 42. As best seen in FIG. 3, thermally conductive gap pads 48 and 50 are located between the capacitor bus-bar 42 and the cold plate 36.

In the inverter 30, the temperature of the capacitor 40 is reduced because the cold-plate 36 cools both the switch unit 38 and the bus-bars 42 that connect the capacitor 40 to the switch unit 38. This requires a longer bus-bar 42, and the longer bus-bar 42 provides a larger surface area to conduct heat from the bus-bar 42 to the cold-plate 36. The bus-bar inductance (which is undesirable) can be kept low by using a laminated bus-bar construction that consists of alternating conductive layers (not shown) which are separated by a dielectric material. Gap pads 48 and 50 are a thermally conductive material which is sandwiched between the bus-bar 42 and the cold-plate 36 to provide an efficient transfer of heat to the cold-plate 36 where it can be removed by flowing liquid coolant (not shown). The cold-plate 36 is designed to route the flow of the coolant beneath the switch unit 38 and the bus-bar 42 to eliminate heat from the inverter 30.

The cooling of the bus-bar 42 can benefit the capacitor 40 in multiple ways. it can prevent heat from flowing into the capacitor 40 from the switch unit 38. It can draw internally generated heat out of the interior of the capacitor 40. It can also reduce the temperature of the bus-bar 42, which will help reduce the convective heating of the air inside the inverter 30. Reduced capacitor temperatures can be leveraged into extended operating lifetime or can result in a smaller capacitor size. The bus-bar 42 cooling may also serve to help cool the switch unit 38. The lower air temperature inside the inverter 30 can also result in advantages in the cost, functionality, and lifetimes of other electronic components used in the inverter 30.

While the disclosure has been illustrated and described in detail in the drawings and foregoing description, such illustration and description is to be considered as exemplary and not restrictive in character, it being understood that illustrative embodiments have been shown and described and that all changes and modifications that come within the spirit of the disclosure are desired to be protected. It will be noted that alternative embodiments of the present disclosure may not include all of the features described yet still benefit from at least some of the advantages of such features. Those of ordinary skill in the art may readily devise their own implementations that incorporate one or more of the features of the present disclosure and fall within the spirit and scope of the present invention as defined by the appended claims.

We claim:

1. A power electronics module comprising:
    a housing forming a cold plate;
    a heat generating electronic first component;
    a heat generating electronic second component having a bus-bar connected to the first component, the second component having a housing forming a side which faces the cold plate, the bus-bar exiting from a central portion of said side of the second component and being positioned adjacent to the cold plate, the bus-bar forming a flat plate which extends from said central portion to and past an edge of said side; and
    the cold plate forming a cooling passage which underlies the first component and the bus-bar.

2. The power electronics module of claim 1, wherein:
    thermally conductive gap pads are located between the bus-bar and the cold plate.

3. The power electronics module of claim 1, wherein:
    the first component comprises a power switch unit.

4. The power electronics module of claim 1, wherein:
    the second component comprises a capacitor.

5. The power electronics module of claim 1, wherein:
    the first component comprises an insulated gate bipolar transistor (IGBT).

6. The power electronics module of claim 1, wherein:
    the second component comprises a DC Link capacitor.

7. A power electronics inverter having a housing forming a cold plate, a heat generating electronic component, and a DC Link capacitor, the improvement wherein:
    the capacitor comprises a bus-bar which exits from a central portion of a side of the capacitor which faces the cold plate, the bus-bar being positioned adjacent to the cold plate, the bus-bar extending from said central portion to and past an edge of said side; and
    the cold plate forming a cooling passage which underlies the component and the capacitor bus-bar.

8. The inverter of claim 7, wherein:
    thermally conductive gap pads are located between the capacitor bus-bar and the cold plate.

9. The inverter of claim 7, wherein:
    the component comprises an insulated gate bipolar transistor (IGBT).

10. A power electronics inverter having a housing forming a cold plate, an insulated gate bipolar transistor (IGBT), and a DC Link capacitor, the improvement wherein:
    the capacitor comprises a bus-bar which exits from a central portion of a side of the capacitor which faces the cold plate, the bus-bar being positioned adjacent to the cold plate, the bus-bar extending from said central portion to and past an edge of said side;
    the cold plate forming a cooling passage which underlies the IGBT and the capacitor bus-bar; and
    thermally conductive gap pads located between the capacitor bus-bar and the cold plate.

\* \* \* \* \*